United States Patent [19]

Blauschild

[11] 3,947,704

[45] Mar. 30, 1976

[54] LOW RESISTANCE MICROCURRENT REGULATED CURRENT SOURCE

[75] Inventor: Robert A. Blauschild, Sunnyvale, Calif.

[73] Assignee: Signetics, Sunnyvale, Calif.

[22] Filed: Dec. 16, 1974

[21] Appl. No.: 532,767

[52] U.S. Cl. ............... 307/297; 307/299 B; 330/28; 330/30 D

[51] Int. Cl.[2] ............... H03K 1/12

[58] Field of Search ............... 330/28, 30 D, 38 M; 307/297, 299 B

[56] References Cited

UNITED STATES PATENTS 3,822,387 7/1974 Mulder ............... 307/299 B

*Primary Examiner*—James B. Mullins
*Attorney, Agent, or Firm*—Flehr, Hohback, Test, Albritton & Herbert

[57] ABSTRACT

A low resistance closed feedback loop regulated current source for supplying a load, the source being of the type including a transistor having input and output electrodes respectively connected between voltage input and current output terminals, and said transistor having a control electrode. The feedback loop includes amplifying means having an output connected to the transistor control electrode and having first and second inputs providing differential current gain for signal current at said inputs and for maintaining minimum differential voltage between said inputs. First and second PN semiconductor structures having first and second electrodes and having dissimilar junction boundary areas are provided with the first electrodes of said structures being connected to the respective first and second inputs of the amplifying means. A resistor is provided connected between the second electrode of the structure having the greater boundary area and the second electrode of the remaining structure. Means is provided coupled to sense current output of said source and is connected to the second electrode of said remaining structure for providing a feedback signal which causes the output of said current source to assume a predetermined value.

9 Claims, 4 Drawing Figures

LOW RESISTANCE MICROCURRENT REGULATED CURRENT SOURCE

BACKGROUND OF THE INVENTION

This invention relates generally to a current source and method of operation. More particularly, this invention relates to a current source having a closed feedback loop to provide regulated operation.

Although regulated current sources have heretofore been provided, such sources require the use of excessively large resistors, particularly for relatively small current outputs. Excessively large resistors require large semiconductor area and have high temperature coefficients in integrated circuit applications. Thus there is a need for a low resistance microcurrent regulated current source.

OBJECTS AND SUMMARY OF THE INVENTION

Accordingly, it is a general object of the present invention to provide an improved low resistance low current regulated current source which occupies reduced semiconductor area.

It is a particular object of the present invention to provide an improved low resistance microcurrent regulated current source utilizing a relatively low value resistor having a low temperature coefficient capable of being formed in an integrated circuit structure.

It is a further particular object of the present invention to provide a method for regulation of a low resistance microcurrent constant current source.

The foregoing and other objects of the invention are achieved in a constant current source, and method of operation, for supplying a load, the source being of the type including a transistor having input and output electrodes respectively connected between voltage input and current output terminals. The transistor has a control electrode having a feedback loop connected thereto. The feedback loop includes amplifying means having an output connected to said transistor control electrode and having first and second inputs for providing differential current gain for signal currents at said inputs and for maintaining minimum differential voltage between said inputs. First and second PN semiconductor structures having first and second electrodes are provided the structures having dissimilar junction boundary areas wherein the first electrodes of the respective structures are connected to the respective first and second inputs of the amplifying means. A resistor is provided connected between the second electrode of the structure having the greater boundary area and the second electrode of the remaining structure. Means is provided coupled to sense current output and connected to the second electrode of the remaining structure for providing a feedback signal which causes the output of said current source to assume a predetermined value.

DESCRIPTION OF THE PREFERRED EMBODIMENTS

Figure 1:
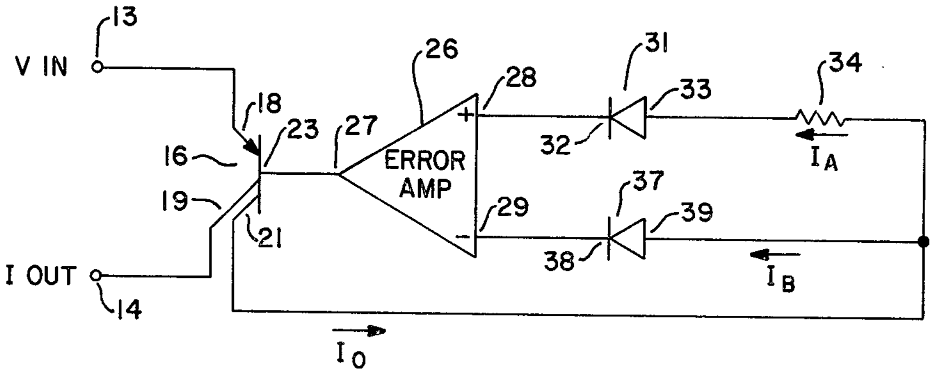
FIG. 1 is a schematic diagram showing a first embodiment in accord with the present invention.

Referring to FIG. 1, the present invention is shown having a voltage input terminal ($V_{in}$) 13 and a current output terminal ($I_o$) 14. A first transistor 16 is included having an emitter 18 connected to terminal 13 and a first collector 19 connected to terminal 14. The transistor has an additional collector 21 and a control electrode 23.

The current source further includes error amplifying means 26 having an output 27 connected to control electrode 23 and having first and second inputs 28 and 29. A first PN semiconductor structure 31 is provided having a junction boundary area and first and second electrodes connected to the respective PN regions. The first or cathode region 32 is connected to input 28 amplifier 26 and the second electrode 33 of anode is connected to a first terminal of resistor 34. A second PN semiconductor structure 37 is provided having a first electrode 38 or cathode and a second electrode 39 or anode. The remaining lead of resistor 34 is connected to electrode 39 of structure 37 and also connected to additional collector 21 of transistor 16.

Although not shown, it is apparent that PN structure 31 and 37 and resistor 34 may be integrally formed in a single semiconductor body. Device 31 and 37 may be formed by first forming isolated spaced regions of one conductivity type in a semiconductor body extending to a surface of said body. Next, opposite conductivity regions may be formed entirely within the first spaced regions and extending to said surface. resistor 34 may be formed simultaneous with the formation of the last formed regions and may be formed using conventional diffusion or ion implantation processing steps. By conventional masking the respective PN junction boundary areas of structures 31 and 39 may be fabricated to be dissimilar such as by control of masking techniques such that the boundary area of structure 31 may be made slightly larger than the area of structure 37. It is further to be noted that resistor 34 can be formed by a resistance region in said body having a temperature coefficient that can be carefully controlled so that the value of resistor 34 can be predetermined to increase with temperature.

The circuit, the structural elements, and their interaction may be predetermined in accord with the following:

Error amplifier 26 is predetermined to have an initial differential current, $I_{id} \simeq 0$ and further having an initial differential voltage $V_{id} \simeq 0$.

In operation, it has been found that the error amplifier 26 having a high gain provides a large differential current gain to force equal currents $I_A$ and $I_B$ through the structures 31 and 37. Structure 31 has been formed to have a greater PN junction boundary area and thus unequal current densities (and corresponding unequal voltages thereacross) occur at the respective structures 31 and 37. However, error amplifier 26 is responsive to provide a minimum or zero differential voltage between inputs 28 and 29, thus the differential voltage developed by the unequal current densities at structural junctions 31 and 37 respectively, causes the resulting differential voltage to appear across resistor 34. As will be appreciated, fabrication of very small area differences between structures 31 and 37 will provide a small differential voltage and thereby a very low current may be generated.

It is to be noted that the error amplifier 26 differential current gain also provides regulation of output current $I_o$ flowing from terminal 14. As $I_o$ increases in magnitude, a greater proportion of the increase in current passes through structure 37 as compared to the current that passes through structure 31 thereby producing a differential input current which via control electrode 23 decreases the output current $I_o$. The negative feedback function continues until $I_{id}$ again approximates zero and thereby establishes $I_o$ at the predetermined current output value.

The output current value may be predetermined by the following:

$$I_A R + V_{dA} = V_{dB} \tag{1}$$

where $I_A$ is the current in the path including the resistor $R$ and $V_{dA}$ and $V_{dB}$ are the differential voltages which appear across the respective structures 31 and 37, based on the assumption that $V_{id}$, the input voltage differential approximates zero.

It is well known to those skilled in the art that the voltage across a PN diode junction may be expressed as:

$$V_d \simeq \frac{kT}{q} \ln \frac{I_d}{I_{od}} \tag{2}$$

where $K$ is Boltzmann's constant, $T$ is the temperature in degrees Kelvin, $q$ is charge, and where initial current $I_{od}$ is proportional to the area of the junction boundary. Substituting:

$$I_A R = \frac{kT}{q} \ln \frac{I_B}{I_A} \frac{\text{area } A}{\text{area } B} \tag{3}$$

It is to be appreciated that in accord with Kirchhoff's current law $$I_{out} = I_A + I_B \tag{4}$$

further:

$$I_A = I_B \; (I_{id} \simeq 0) \tag{5}$$

therefore:

$$I_{out} = \frac{2kT}{qR} \ln \frac{\text{area } A}{\text{area } B} \tag{6}$$

It is thus to be noted by selecting a junction boundary area of structure 31 to be slightly larger than the area of structure 37 the $1n$ of the ratio of the areas will be small and a corresponding low output current may thus be realized without the necessity of using an excessively large resistor $R$. As was previously noted, it can be seen that $I_o$ may be predetermined to have a low temperature coefficient by virtue of selection of $R$ which may be formed to have a temperature coefficient such that the resistance may be made to increase with temperature offsetting the increase in beta of the active transistors in the circuit.

Figure 2:
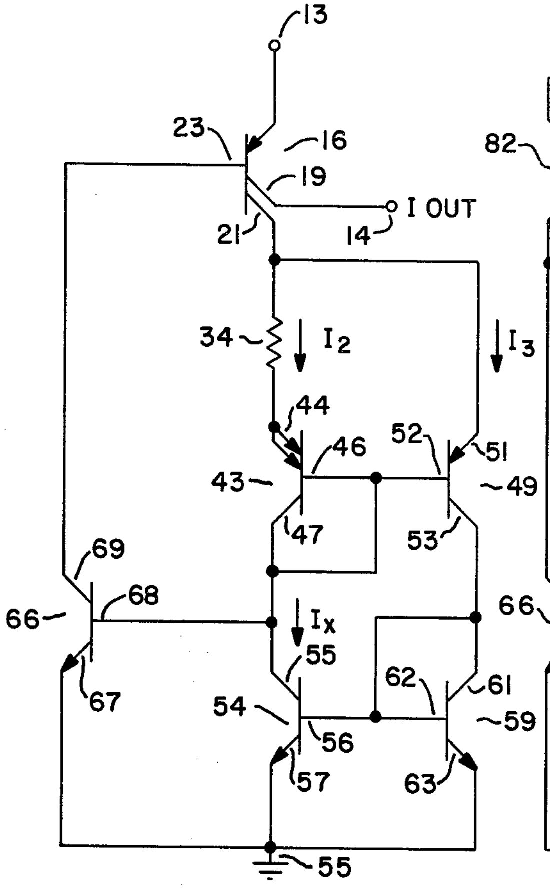
FIG. 2 is a schematic diagram showing an additional embodiment of the current source utilizing an amplifier having dissimilar PN junction inputs.

Referring to FIG. 2, an additional embodiment of the FIG. 1 current source is shown. The combination of the previously discussed PN semiconductor structures 31 and 37 are now represented by the inputs to transistors 43 and 49, specifically the PN junction having the greater area being shown as first and second paralleled emitter electrodes 44 forming a PN junction with base 46 of transistor 43 an emitter 51 forming a PN junction with base 52 of transistor 49. PNP transistors 43 and 49 perform the input of an emitter input differential amplifier similar to that disclosed in copending application Ser. No. 533,141, filed Dec. 12, 1974 and assigned to the assignee herein. The bases 46 and 52 are connected to collector 47 of transistor 43. The collector 47 of transistor 43 is connected to collector 55 of transistor 54, an NPN transistor. The emitter 57 of transistor 54 is connected to common or ground terminal 55. The base 56 of transistor 54 is connected to base 62 of NPN transistor 59. Emitter 63 of transistor 59 is connected to the common or ground terminal 55 and collector 61 is connected to base 62 and also collector 53 of transistor 49. Collector 55 of transistor 54 is further connected to base 68 of transistor 66, a NPN transistor. Emitter 67 of transistor 66 is connected to common or ground terminal 55 and collector 69 is connected to the base 23 of transistor 16 previously described.

It is to be appreciated that in operation of the circuit of FIG. 2:

$$I_2 R + V_{BE_2} = V_{BE_3}$$

where $I_2$ is the current in resistor 34 ($R$), $V_{BE_2}$ is the base-to-emitter voltage of transistor 43 and $V_{BE_3}$ is the base-to-emitter voltage of transistor 49.

Assuming relatively high betas for the respective devices, that is, $\beta_{npn}$ and $\beta_{pnp}$, $$I_{c_3} = I_3 = I_{c_5} = I_{c_4} \; ; \; I_x = I_2$$

where $I_x$ is the current flowing from the connected base 46 and collector 47 electrodes of transistor 43 and $I_2$ is the current flowing through resistor 34 ($R$). Further:

$$I_{B_6} = I_x - I_{c_4} = I_2 - I_3$$

where $I_{B_6}$ is the base current of transistor 66

$$I_{out} = \beta_n \, \beta_p \, I_{B_6} = \beta_n \, \beta_p (I_2 - I_3).$$

For large $\beta_n \, \beta_p$, $I_2 - I_3 \simeq 0$ $$\text{Thus } I_o = \frac{2kT}{qR} \ln \left( \frac{PN \text{ junction area of emitter 44}}{PN \text{ junction area of emitter 51}} \right).$$

It is thus to be appreciated that when a voltage input is applied between terminals 13 and ground terminal 55 and a load connected between terminal 14 and terminal 55 that closed-loop differential amplification and regulation is obtained. As was previously discussed in conjunction with FIG. 1, the error amplifier including transistors 43, 49, 54, 59, and 66 is responsive to provide initial differential current approximating zero and further initial differential voltage between said inputs approximating zero. Again it is to be noted that the PN structures previously described as 31 and 37 have been included at the respective PN input emitter-base junctions of transistors 43 and 49 and said transistors further provide a portion of the closed-loop feedback amplification for the current source.

Figure 3:
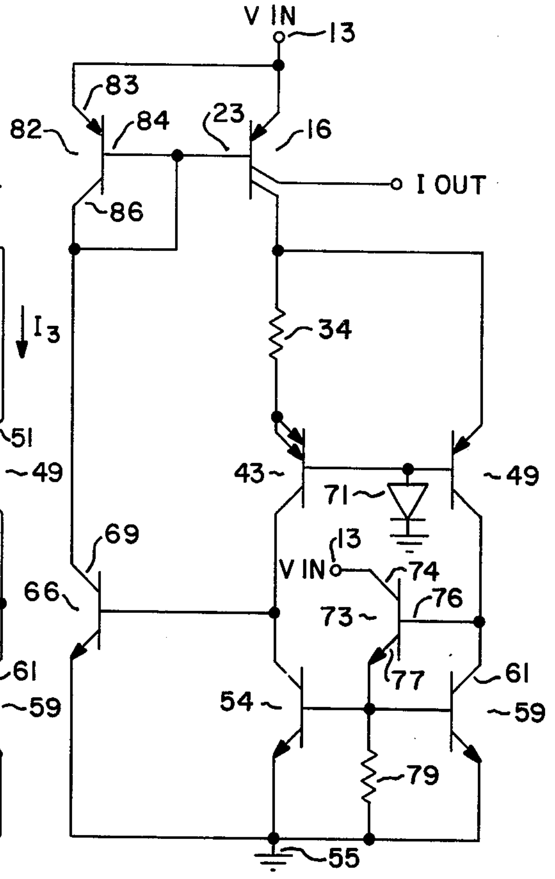
FIG. 3 is a schematic diagram of an additional embodiment of the present invention showing the FIG. 2 circuit together with additional circuitry.

Referring to FIG. 3 additional circuitry has been added to the circuit of FIG. 2 to minimize the effects of beta variations between the respective devices. A diode 71 has been included to forward bias transistors 43 and 49 in order that the respective device base currents are not added to the $I_x$ current previously discussed and thereby produce an undesirable error. Diode 71 has an anode connected to the interconnected bases 46 and 52 and a cathode connected to common or ground terminal 55. The connection between base 46 and collector 47 has been removed. Moreover, and in like manner, an additional transistor 73 is provided having a collector 74 connected to terminal 13, a base 76 connected to collector 61 and an emitter 77 connected to the interconnected bases 56 and 62 to minimize the error contributed by the base currents of transistors 54 and 59.

The connection between collector 61 and base 62 has been removed. Further it may be preferably to add an additional resistor 79, connected between emitter 77 and common or ground terminal 55, to increase the operating current of transistor 73 and thereby operate transistor 73 in the increased beta region of the device operating characteristics. An additional transistor 82 may be interposed between the collector 69 of transistor 66 and the base of transistor 16 for increasing the operating current of transistor 66 and thereby permit the transistor to operate in the increased beta portion of its operating characteristics. Transistor 82 has an emitter 83 connected to terminal 13, a base 84 connected to base 23 of transistor 16 and also connected to collector 86 of transistor 82. Collector 86 is connected to collector 69 of transistor 66. In operation the circuit of FIG. 3 is identical to that of FIG. 2 differing only in that the circuit provides additional circuit elements which minimize beta variations of the transistors previously discussed in conjunction with FIG. 2.

Figure 4:
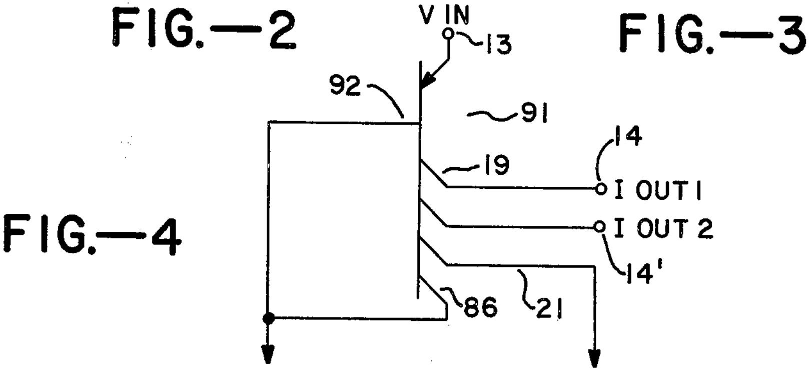
FIG. 4 is a schematic diagram of a transistor having a plurality of output electrodes for utilization in accord with the present invention.

Referring to FIG. 4, a multicollector transistor 91 is shown which may be substituted for the FIG. 3 combination of transistors 16 and 82. An extended base region 92 includes the combination of bases 23 and 84 previously discussed. A first collector 19 functions similar to the previously referenced collector 19 of transistor 16 and is connected to output terminal 14. An additional collector may be provided for a second output 14'. An additional collector is substituted for collector 21 of device 16 previously described and a fourth collector is substituted for collector 86 of device 82 previously described. Collector 86 and extended base 92 are connected to collector 69 of device 66 previously described. Operation of the current source including transistor 91 is identical to that previously discussed for the combination of transistors 16 and 82 of FIG. 3 with an additional output 14' provided to function identical to output 14, although collector areas may be scaled to produce scaled output currents.

Thus it is apparent that there has been provided an improved low resistance low current regulated source which occupies reduced semiconductor area.

Further, there has been provided an improved method and low resistance microcurrent regulated current source utilizing a relatively low value resistor having a low temperature coefficient when formed in an integrated circuit structure.

I claim:

1. In a current source having a regulating transistor and a feedback loop for supplying a regulated current to a load, said transistor having input and output electrodes connected between input and output terminals, the improvement wherein the feedback loop comprises: amplifying means having first and second inputs and an output connected to the control electrode of the transistor, first and second PN semiconductor junctions of dissimilar areas connected between the output of the transistor and the respective inputs of said amplifying means, and a resistor connected electrically in series with the PN junction of greater area between the output of the transistor and the input of the amplifying means, said amplifying means serving to maintain substantially equal currents through the PN junctions and a differential voltage substantially equal to zero between the inputs of the amplifying means, whereby dissimilar voltage drops are produced across the junctions and a corresponding voltage drop is developed across the resistor, said corresponding voltage drop serving as a reference voltage for determining the level of the current supplied to the load.

2. In a regulated current source having an input terminal for connection to a source of energy and an output terminal for delivering a relatively samll, regulated output current to a load: a transistor having an input electrode connected to the input terminal, an output electrode connected to the output terminal, and a control electrode for controlling the amount of current delivered by the output electrode to the output terminal; first and second non-linear devices adapted for producing dissimilar voltage drops in response to equal currents flowing therethrough; differential amplifier means having inputs connected to the non-linear devices and an output connected to the control electrode of the transistor; means for applying feedback currents having a predetermined relationship to the load current to the inputs of the amplifier means through the non-linear devices; and a resistive element connected electrically in series with the first non-linear device; said amplifier means serving to maintain the currents through the non-linear devices substantially equal in magnitude and the voltage differential between the inputs of the amplifier means at a predetermined level, whereby the feedback currents produce dissimilar voltage drops across the non-linear devices and a corresponding voltage drop across the resistive element, the voltage drop across the resistive element and the resistance of said element determining the level of the feedback currents and therefore the level of the load current.

3. The current source of claim 2 wherein the non-linear devices are PN semiconductor junctions of dissimilar areas.

4. The current source of claim 3 wherein the PN junctions are the anode-cathode junctions of semiconductor diodes.

5. The current source of claim 3 wherein the PN junctions are the emitter-base junctions of transistors.

6. The current source of claim 2 wherein the transistor has first and second output electrodes, the first output electrode being connected to the output terminal and the second output electrode being connected to the non-linear devices.

7. The current source of claim 2 wherein the predetermined voltage differential between the inputs of the amplifier means is substantially equal to zero volts.

8. In a method for supplying a regulated output current to a load from a current source having a regulating transistor with input, output and control elements, the steps of: applying first and second currents having a predetermined relationship to the output current to the inputs of a differential amplifier through first and second PN junctions of dissimilar areas and through a resistor connected electrically in series with one of the junctions, applying the output of the differential amplifier to the control electrode of the transistor, and operating the differential amplifier to maintain the first and second currents at substantially equal levels and to maintain a predetermined voltage differential between the inputs of said amplifier, thereby producing dissimilar voltage drops across the first and second junctions and a corresponding voltage drop across the resistor, the voltage drop developed across the resistor and the value of the resistor determining the level of the first and second currents and therefor the level of the operating current.

9. The method of claim 8 wherein the differential amplifier is operated to maintain a voltage differential on the order of zero volts at the inputs thereof.

* * * * *